United States Patent [19]
Windischmann

[11] Patent Number: 5,507,987
[45] Date of Patent: Apr. 16, 1996

[54] METHOD OF MAKING A FREE-STANDING DIAMOND FILM WITH REDUCED BOWING

[75] Inventor: Henry Windischmann, Northborough, Mass.

[73] Assignee: Saint Gobain/Norton Industrial Ceramics Corp., Worcester, Mass.

[21] Appl. No.: 234,818

[22] Filed: Apr. 28, 1994

[51] Int. Cl.$^6$ .................... B29C 41/42; C23C 16/26
[52] U.S. Cl. .............. 264/81; 427/249; 427/255.7; 427/122; 427/577; 423/446
[58] Field of Search .................. 264/81; 427/249, 427/255.7, 577, 122; 423/446; 117/929

[56] References Cited

U.S. PATENT DOCUMENTS

| | | |
|---|---|---|
| 4,471,003 | 9/1984 | Cann . |
| 4,487,162 | 12/1984 | Cann . |
| 4,707,384 | 11/1987 | Schachner et al. . |
| 4,900,628 | 2/1990 | Ikegaya et al. . |
| 4,987,002 | 1/1991 | Sakamoto et al. . |
| 4,988,421 | 1/1991 | Drawl et al. ............. 427/249 |
| 5,006,203 | 4/1991 | Purdes . |
| 5,114,745 | 5/1992 | Jones . |
| 5,124,179 | 6/1992 | Garg et al. ............. 427/249 |
| 5,139,372 | 8/1992 | Tanabe et al. . |
| 5,204,144 | 4/1993 | Cann et al. . |
| 5,260,106 | 11/1993 | Kawarada et al. ........ 427/577 |
| 5,270,077 | 12/1993 | Knemeyer et al. . |
| 5,294,381 | 3/1994 | Iguchi et al. ............ 427/250 |
| 5,310,512 | 5/1994 | Bigelow . |
| 5,314,652 | 5/1994 | Simpson et al. ............. 264/81 |

FOREIGN PATENT DOCUMENTS

| | | |
|---|---|---|
| 0442303A1 | 8/1991 | European Pat. Off. . |
| 0523968A1 | 1/1993 | European Pat. Off. . |
| 63307196 | of 1989 | Japan . |

OTHER PUBLICATIONS

Abstract (Dialog) From Diamond Film Update of Jun. 16, 1994—"CVD Diamond Film Without Stress Cracks" (1 sheet).

*Primary Examiner*—Roy V. King
*Attorney, Agent, or Firm*—Martin Novack; Volker R. Ulbrich

[57] ABSTRACT

A method for producing free-standing diamond film having a surface area of at least 1000 square millimeters includes the following steps: providing a substrate; depositing, on the substrate, by chemical vapor deposition, a first layer of diamond over a surface area of at least 1000 square millimeters, and to a first thickness, the first layer being deposited at a first deposition rate; depositing, on the first layer, a second layer of diamond, over a surface area of at least 1000 square millimeters, and to a second thickness, the second layer being deposited at a second deposition rate; and releasing the diamond from the substrate; the second deposition rate being as lest twice as high as the first deposition rate, and the first thickness being sufficiently thick to prevent the released diamond from bowing by more than a given distance.

8 Claims, 2 Drawing Sheets

METHOD OF MAKING A FREE-STANDING DIAMOND FILM WITH REDUCED BOWING

FIELD OF THE INVENTION

This invention relates to synthetic diamond and, more particularly, to synthetic diamond film with reduced bowing, and to a method of making same.

BACKGROUND OF THE INVENTION

Diamond has a number of properties which make it attractive for use in various applications. Diamond has the highest thermal conductivity of any known material, and is an electrical insulator, so it is an ideal heat sink material. Other useful properties are extreme hardness, thermal stability, and excellent transmissivity of certain radiation. However, natural diamond is prohibitively expensive for applications which require any substantial size.

In recent years, a number of techniques have been developed for synthesizing diamond and for depositing synthetic diamond to obtain a diamond film or coating. These techniques include so-called high-pressure high-temperature ("HPHT") methods and chemical vapor deposition ("CVD") methods. The CVD methods include plasma deposition techniques wherein, for example, plasmas of a hydrocarbon and hydrogen are obtained using electrical arcing. The resultant plasma can be focused and accelerated toward a substrate using focusing and accelerating magnets. Reference can be made, for example, to U.S. Pat. Nos. 4,471,003, 4,487,162, and 5,204,144 for description of examples of a type of plasma jet deposition that can be utilized to deposit synthetic diamond on a substrate.

Synthetic diamond film can be deposited, for example, as a permanent coating on a substrate, such as on the wear surface of a tool or as an environmentally protective coating. Such films are generally considered to be relatively thin films. Alternatively, a synthetic diamond film that is generally considered a thick film, can be deposited on a substrate and then removed, preferably intact as a single "free standing" piece, for use in applications such as heat sinks, optical windows, and in tools. However, the obtainment of such thick films, especially of relatively large area, has proven troublesome. In addition to the difficulty of depositing quality synthetic diamond of substantial thickness, there is the problem of removing the diamond intact from the substrate. The substrate material will generally have a different coefficient of expansion than the diamond, as well as a different molecular and chemical structure. The adherence and growth of the diamond film, as well as its release, will depend, inter alia, on the materials used, surface preparation, and deposition parameters. Reference can be made, for example, to copending U.S. patent application Ser. No. 07/973,994, now U.S. Pat. No. 5,314,652 assigned to the same assignee as the present application, which discloses techniques for fabricating free-standing synthetic diamond films utilizing specified substrate roughnesses to help prevent premature lift-off of diamond film and to facilitate appropriate intact release thereof. As disclosed in the referenced copending Application, the substrate can include an interlayer (such as titanium nitride) which further facilitates the technique.

A further problem in CVD synthetic diamond deposition that needs to be addressed is the distortion (called bowing or curling) of the diamond film, particularly after its release from the substrate on which it has been deposited. (As used herein, "substrate" is intended to broadly mean any surface on which the diamond is deposited). It has been recognized that bowing can somehow result from intrinsic stress in the deposited diamond. Prior art (e.g. U.S. Pat. No. 5,270,077) indicates that diamond coatings grow in tension due to growth defects and the "intrinsic strain" therein is proportional to the coating thickness and also to the rate of deposition. The '077 Patent states that this intrinsic strain manifests itself by a bowing and/or cracking in the diamond film that has been released from a rigid substrate. After release, the diamond film relieves the tensile stress which was within the diamond coating by bowing into a curved configuration or by cracking. The '077 Patent indicates that the bowing that results upon release of the tensile stress in the diamond coating can be compensated for by growing the diamond coating on a convex growth surface such that, when the diamond coating is released from the substrate, the diamond coating will relieve the inherent tensile stress therein by bowing into a flat configuration without the formation of cracks or fragmentation. The '007 Patent further indicates that the diamond coating can be grown in a curved configuration on the substrate which is opposite to the direction of the stress-relieving deformation that results when the coating is released from the substrate. By matching the curvature of the substrate to the tensile stress created in a CVD diamond film as it grows, the '007 Patent indicates that stress-relieving deformation flattens the film when released from the substrate.

Applicant has found that the direction of bowing described in the '007 Patent generally does not occur in the CVD processes employed by Applicant, and that bowing generally occurs in the opposite direction, that is, with the deposition side (not the substrate side) bowing to a convex shape. Also, the behavior of diamond films indicates that a different understanding of the intrinsic stress phenomenon is required to account for and successfully address problems of bowing in relatively large area free-standing diamond films.

It is among the objects of the present invention to improve techniques for producing relatively large area free-standing diamond films, and to reduce stresses which produce distortions and other problems in the fabrication of such films.

SUMMARY OF THE INVENTION

Applicant has discovered that the undesirable bowing of relatively large area diamond films (greater than 1000 square millimeters—which is the approximate area of a disc of 1.4 inch diameter) can be reduced by reducing the severe non-uniform intrinsic stress distribution across the diamond thickness that causes the diamond to bow after it is released from the substrate.

A diamond film deposited on a substrate is in a state of stress. The nature of the stress is two-fold. The first type is thermal stress arising from the mismatch in thermal coefficient of expansion between film and substrate. It is well understood that this type of stress can be reduced by matching the thermophysical properties and reducing the deposition temperature. The second type of stress is intrinsic or growth stress arising from the chemical and structural imperfections incorporated and locked in the film during deposition. This type of stress is first referred to in the background hereinabove, but Applicant has recognized that it is the intrinsic stress gradient that governs distortion, and can be controlled in an advantageous manner to reduce or eliminate distortions. In particular, the intrinsic stresses are characteristic of and inherent to the deposition processes and governed by the microstructural heterogeneity. For example, it is characteristic of films prepared by chemical vapor deposition, regardless of the nature of the material, to grow in a stratified grain structure composed of a layer of randomly oriented, relatively fine grains in the nucleation zone, followed by highly oriented columnar grains of higher structural perfection. The intrinsic stress generation mechanism is related to the microstructure, and Applicant postulates that the stratified microstructural gradient establishes a stress gradient that leads to film distortion (bowing) of free-standing films, as well as to bending of the substrate/ film composite in the case of attached film-substrate structures. Consequently, by controlling the microstructure/defect density gradient through the film thickness, the stress which produces the distortion can be reduced.

In accordance with a feature of the invention, the curl/distortion (bow) of relatively large area diamond film is reduced by reducing defect density in the initial deposition zone of the diamond film, and thereby reducing the stress gradient that gives rise to the distortion. In a form of the invention, a method is set forth for producing free-standing diamond film having a surface area of at least 1000 square millimeters, comprising the following steps: providing a substrate; depositing, on the substrate, by chemical vapor deposition, a first layer of diamond over a surface area of at least 1000 square millimeters, and to a first thickness, the first layer being deposited at a first relatively low deposition rate; depositing, on the first layer, a second layer of diamond, over a surface area of at least 1000 square millimeters, and to a second thickness, the second layer being deposited at a relatively high deposition rate; and releasing the diamond from the substrate; the first thickness being sufficiently thick to prevent the released diamond from bowing by more than a given distance. In general, bowing will increase for larger area diamond (if there is, say, a given curvature per unit length) and decrease for thicker diamond (with a thicker material bending less for a given stress). In an embodiment hereof, the first thickness is sufficiently thick to prevent the released diamond from bowing by more than $0.01(L/t)^2$ microns, where L is the longest dimension (in millimeters) of the surface area of the diamond, and t is the thickness of the diamond (in millimeters). Thus, for example, for a 4 inch (100 mm) diameter diamond disc of 1000 micron (1 mm) thickness, the maximum acceptable bow would be $(0.01)(100/1)^2 = 100$ microns. In an embodiment of the invention, the first thickness is at least 150 microns, and the total of said first and second thicknesses is at least 1000 microns. Also in an embodiment hereof, the second deposition rate is at least twice as high as the first deposition rate. The first and second deposition rates can be variable, and the transition therebetween can be discrete or continuous.

Examples hereof demonstrate, inter alia, that an initial layer of diamond that has a relatively low intrinsic stress (i.e., relatively low defect density, which can be obtained using a relatively low deposition rate), and at least a certain minimum thickness, is effective in minimizing bowing in free-standing diamond of at least a particular size and total thickness, even when most of the diamond thickness is deposited less expensively at a relatively high deposition rate.

Further features and advantages of the invention will become more readily apparent from the following detailed description when taken in conjunction with the accompanying drawings.

DETAILED DESCRIPTION

Figure 1:
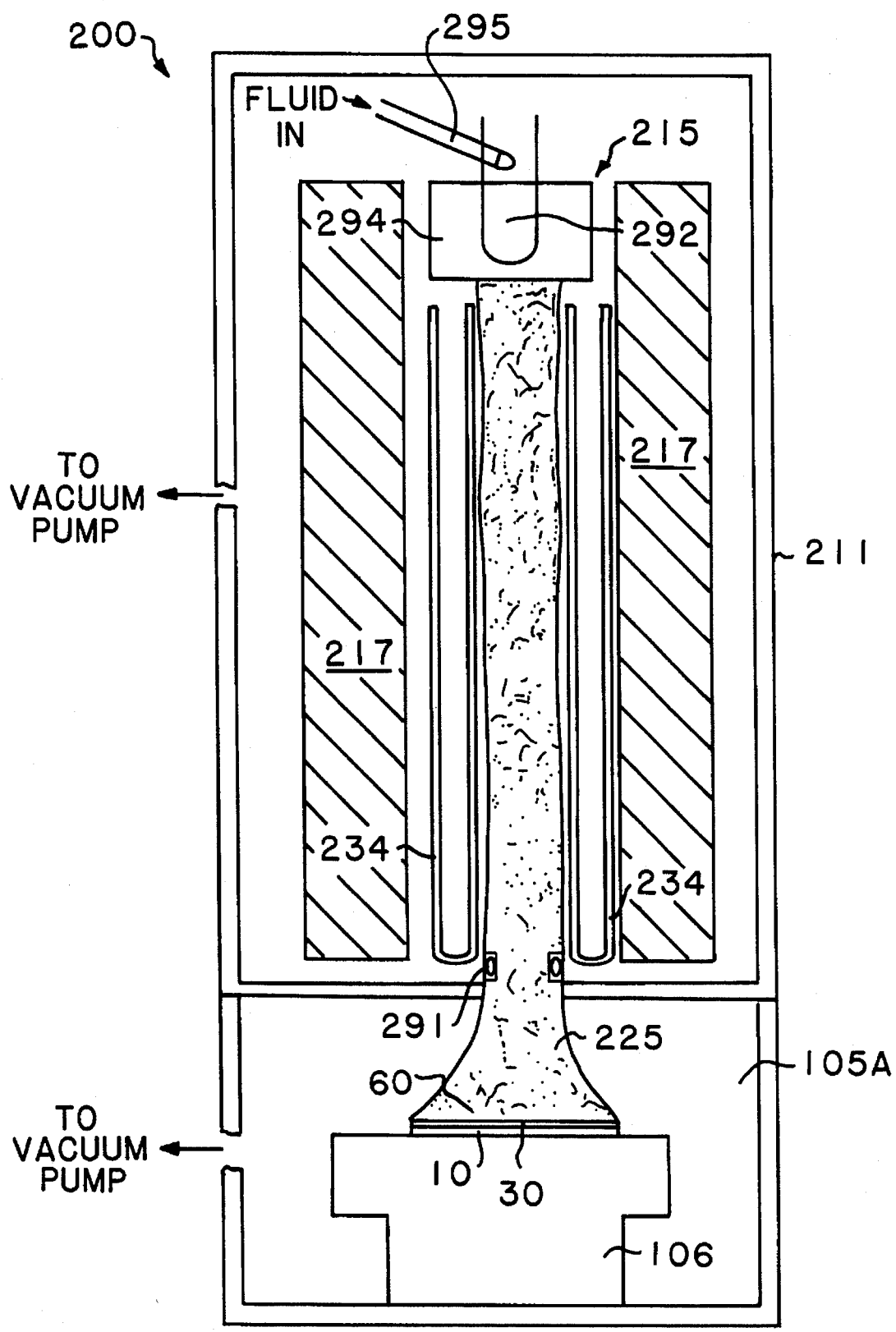
FIG. 1 is a cross-sectional schematic representation, partially in block form, of an apparatus that can be used in practicing the invention.

Referring to FIG. 1, there is shown a diagram of a plasma jet deposition system 200 of a type which can be utilized in practicing an embodiment of the invention. The system 200 is contained within a housing 211 and includes an arc-forming section 215 which comprises a cylindrical cathode holder 294, a rod-like cathode 292, and an injector 295 mounted adjacent the cathode so as to permit injected fluid to pass over the cathode 292. A cylindrical anode is represented at 291. In the illustrated system the input fluid may be a mixture of hydrogen and methane. The anode 291 and cathode 292 are energized by a source of electric potential (not shown), for example a DC potential. Cylindrical magnets, designated by reference numeral 217, are utilized to control the plasma generated at the arc forming section. The magnets maintain the plasma within a narrow column until the plasma reaches the deposition region 60. Optional cooling coils 234, in which a coolant can be circulated, can be located within the magnets.

In operation, a mixture of hydrogen and methane is fed to the injector 295, and a plasma is obtained in front of the arc forming section and accelerated and focused toward the deposition region. The temperature and pressure at the plasma formation region are typically in the approximate ranges 1500–15,000 degrees C. and 100–700 torr, respectively, and in the deposition region are in the approximate ranges 800–1100 degrees C. and 0.1–200 torr, respectively. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144. It will be understood that other suitable types of deposition equipment, including other types of CVD deposition equipment, can be used in conjunction with the features of the invention to be described.

The bottom portion 105A of the chamber has a base 106 on which can be mounted a substrate 10 on which the synthetic diamond is to be deposited. The base can include a temperature controller. The substrate may be, for example, molybdenum, tungsten, or graphite, with molybdenum (and its alloys such as TZM, which contains relatively small percentages of titanium and zirconium) being presently preferred. Reference can be made, for example, to copending U.S. patent application Ser. No. 973,994, now U.S. Pat. No. 5,314,652 assigned to the same assignee as the present Application, which describes considerations of roughness of the substrate with regard to appropriate holding and release of the diamond during and after deposition, and also describes the advantageous use of an interlayer (e.g. illustrated at 30 in FIG. 2), such as a titanium nitride interlayer, for coating the substrate on which the synthetic diamond is to be deposited and ultimately released. The substrate can be tilted and rotated during deposition as described, for example, in U.S. Pat. No. 5,204,144.

Figure 2:
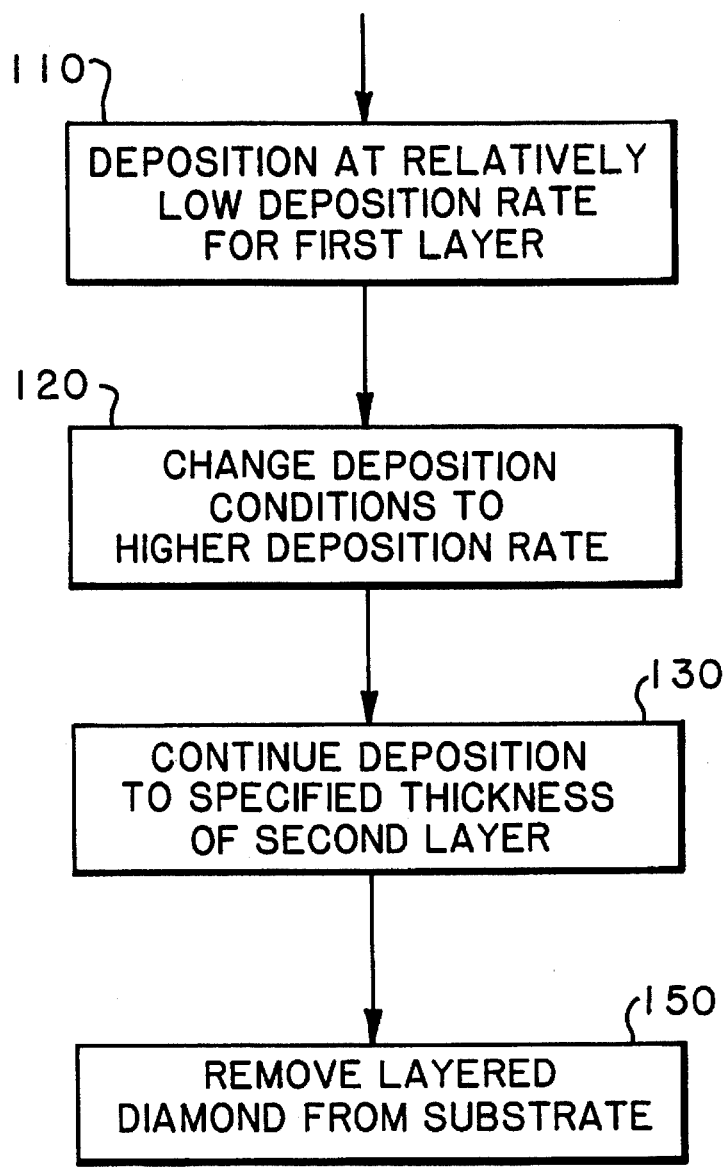
FIG. 2 is an operational flow diagram of a technique in accordance with an embodiment of the invention.

Referring to FIG. 2, there is shown an operational flow diagram of the steps of a procedure for making polycrystalline synthetic diamond film in accordance with an embodiment of the invention. The block 110 represents the deposition, at a relatively low deposition rate, of a specified thickness of diamond film. The surface area deposited is at least 1000 square millimeters, but may be much larger. In an example of the present embodiment, deposition covers the surface of a 4 inch diameter disc which is tilted and rotated during deposition. The thickness of the initial layer is at least 150 microns. In an example of the present embodiment, the deposition conditions, for an equipment of the type shown in FIG. 1, which result in a deposition rate of about 4 µm/hr. (and diamond that is relatively low in defects) may be, for example, as follows:

| Deposition temperature | 850° C. |
|---|---|
| Enthalpy | 70 kJ/g H2 |
| Pressure | $10^3$ Pa |
| Methane concentration | .06 percent |
| Hydrogen concentration | balance |

After the desired thickness of the first layer has been deposited (in this example, after at least about 38 hours), the block 120 represents changing the deposition conditions to deposit diamond at higher deposition rate (permitting a higher level of defects in the diamond). In this example, although this layer will be of lower quality than the initial layer, it is still fairly good quality synthetic diamond that has a relatively high thermal conductivity and may be employed, for example, in heat sinking applications. The second deposition rate for this example is at a deposition rate of about 11 µm/hr. The deposition conditions may be, for example, the same as listed above, but with the methane concentration at about 0.12 percent. Deposition under these conditions is continued (block 130), in this example, for about 78 hours, until the second layer thickness is at least about 850 microns. In the present example, the total film thickness is just over 1000 microns (1 mm). The thermal conductivity of even the higher growth rate material is still quite good, being approximately 10 W/cm °K.

The layered diamond structure can then be released from the substrate, such as by cooling (see above-referenced copending U.S. patent application Ser. No. 973,994 now U.S. Pat. No. 5,314,652), and removed from the deposition chamber, as represented by the block 150.

Figure 3:
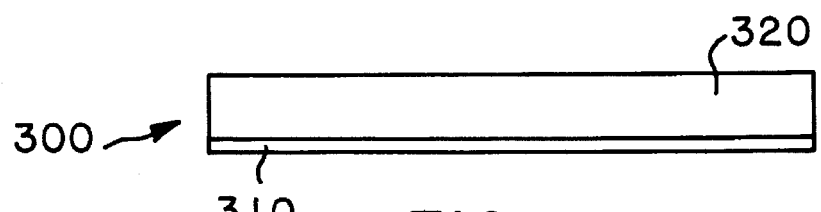
FIG. 3 is a cross-sectional representation of a diamond film made in accordance with an embodiment of the invention.

FIG. 3 illustrates the diamond film structure 300 of the above example, with the substrate side layer being represented at 310, and the deposition side layer at 320.

EXAMPLES

In the examples that follow 4 inch diameter discs of synthetic diamond were produced using equipment and deposition conditions of the types just described. Nucleation density was controlled by varying the time at which the carbonaceous feedstock gas (in this case, methane) is introduced into the plasma, which is initially argon and hydrogen, during the substrate heating phase. In general, the earlier the methane is introduced, the higher the nucleation rate. After deposition, nucleation density was measured as the number of crystal grains per square millimeter of surface area, as determined using a scanning electron microscope on the nucleation side of the sample disc. The samples produced had so-called "flashing" which is the periphery of the sample that overlaps the edges of the circular mandrel and forms a rough annular rim. Before measuring bow, the flashing was cut away, using a laser. Bow was measured with an optical profilometer, and measured from the low point of the cupped surface to the plane defined by the highest points on the diamond sample periphery. Bow, as measured, and as referred to herein, is measured after release and cooling to room temperature, and includes any component of bow resulting from mandrel distortion which is caused such as by the thermal gradient across the mandrel thickness. Mandrel distortion in the examples hereof was estimated to be about 40 microns.

Example I

In this example, two synthetic diamond discs of thicknesses greater than 1000 microns were made at a deposition rate of about 11.7 microns per hour. One such disc was about 1,054 microns thick, had a measured nucleation density of about $1.6 \times 10^5$ per $mm^2$, and a measured bow of about 150 microns. The other disc was about 1070 microns thick, had a measured nucleation density of greater than 107 per $mm^2$, and a measured bow of about 130 microns. (In these and other described examples, bowing of the released diamond is with the deposition side curving to a convex shape.) Thus, relatively large bowing, of greater than 100 microns, was observed for these discs. (For a 4 inch disc of about 1000 micron thickness, a bow of $0.01(L/t)^2$ microns (where L, the longest dimension, is the 100 millimeter diameter, and t is a thickness of about 1 millimeter) is considered problematic.) In general, from these and other samples, it was determined that diamond deposited at a relatively high deposition rate (11.7 microns per hour being a relatively high deposition rate for the equipment, parameters, and geometries hereof) exhibited problematic bowing.

Example II

In this example, a synthetic diamond disc was made at a much lower deposition rate of about 4.8 microns per hour. The disc was about 1330 microns thick, had a measured nucleation density of about $16 \times 10^5$ per $mm^2$, and a measured bow of about 50 microns. In general, from this and other samples, it was determined that diamond deposited at a relatively low deposition rate (4.8 microns per hour being an example of a relatively low deposition rate for the equipment, parameters, and geometries hereof) did not exhibit problematic bowing.

Example III

In this example, diamond disc samples were made in layers, with the initial (first) deposition rate being relatively low and the second deposition rate being relatively high. The thickness of the first layer for these samples was about 120 microns. In one of these samples, where the initial lower deposition rate was about 4.8 microns per hour, and the subsequent higher deposition rate was about 11.6 microns per hour, the resultant diamond disc was about 1040 microns thick, had a measured nucleation density of about $1.4 \times 10^6$, and a measured bow of about 149 microns. In another of the samples, where the lower deposition rate was about 3.0 microns per hour, and the subsequent higher deposition rate was 11.6 microns per hour, the resultant diamond disc was about 1040 microns thick, had a measured nucleation density of about $4 \times 10^4$, and a measured bow of about 120 microns. It was seen from this and similar examples that, for the sample size and thickness involved, the 120 microns of initial relatively low defect (from relatively low deposition rate) layer is insufficient to prevent unacceptable bowing of the ultimate sample.

Example IV

In this example, samples were again made in layers, with an initial low deposition rate. The thickness of the first layer for these samples was about 380 microns. Several samples were made, with thicknesses varying between about 1230 microns and 1490 microns. The lower deposition rate for these samples was about 4.8 microns per hour, and the higher deposition rate was about 11.6 microns per hour. Nucleation density was about $4.9 \times 10^5$ per $mm^2$ for one sample, and greater than $10^7$ per $mm^2$ for most of the other samples. In each case the measured bow was less than 100 microns, with the measured bow ranging from about 50 microns to about 99 microns, and averaging about 64 microns. It was seen from this and similar examples that, for the sample size and thickness involved, the 380 microns of initial relatively low defect layer is sufficient (and probably more than sufficient) to prevent unacceptable bowing of the ultimate sample.

Example V

In this example, samples were again made in layers, with an initial low deposition rate. The thickness of the first layer for these samples was about 180 microns. Two samples were made, with thicknesses of about 1180 microns and 1270 microns. The lower deposition rate for these samples was about 4.8 microns per hour, and the higher deposition rate was about 11.6 microns per hour. Nucleation density for both was greater than $10^7$ per $mm^2$. In each case the measured bow was less than 100 microns, with the measured bow for the 1180 micron thick sample being about 48 microns, and the measured bow for the 1270 micron thick sample being about 89 microns. It was seen from this and similar examples that, for the sample size and thickness involved, the 180 microns of initial relatively low defect layer is sufficient to prevent unacceptable bowing of the ultimate sample. As seen in EXAMPLE III, 120 microns is insufficient. A thickness of 150 microns is considered just sufficient.

The invention has been described with regard to particular preferred embodiments, but variations within the spirit and scope of the invention will occur to those skilled in the art. For example, the illustrated layers and technique involve a discrete between deposition rates, but, if desired, the deposition conditions could be changed gradually, whereby a transition region of any desired size will result.

I claim:

1. A method for producing a free-standing diamond film having a surface area of at least 1000 square millimeters, comprising the steps of:

providing a substrate;

depositing, on said substrate, by chemical vapor deposition, a first layer of diamond over a surface area of at least 1000 square millimeters, and to a first thickness, said first layer being deposited at a first deposition rate;

depositing, on said first layer, a second layer of diamond, over a surface area of at least 1000 square millimeters, and to a second thickness, said second layer being deposited at a second deposition rate; and releasing said diamond from said substrate;

said second deposition rate being at least twice as high as said first deposition rate, and said first thickness being sufficiently thick to prevent the released diamond from bowing by more than a given distance.

2. The method as defined by claim 1, wherein said first thickness is sufficiently thick to prevent the released diamond from bowing by more than $0.01(L/t)^2$ microns, where L is the longest dimension in millimeters of the surface area of the diamond, and t is the thickness of the diamond in millimeters.

3. The method as defined by claim 1, wherein said first thickness is at least 150 microns and the total of said first and second thicknesses is at least 1000 microns.

4. The method as defined by claim 2, wherein said first thickness is at least 150 microns and the total of said first and second thicknesses is at least 1000 microns.

5. A method for producing a free-standing diamond film having a surface area of at least 1000 square millimeters, comprising the steps of:

providing a substrate;

depositing, on said substrate, by chemical vapor deposition, a first layer of diamond over a surface area of at least 1000 square millimeters, and to a first thickness, said first layer being deposited at a first deposition rate;

depositing, on said first layer, a second layer of diamond, over a surface area of at least 1000 square millimeters, and to a second thickness, said second layer being deposited at a second deposition rate; and releasing said diamond from said substrate;

said second deposition rate being at least twice as high as said first deposition rate;

said first thickness being at least 150 microns and the total of said first and second thicknesses being at least 1000 microns.

6. The method as defined by claim 5, wherein said first thickness is sufficiently thick to prevent the released diamond from bowing by more than $0.01(L/t)^2$ microns, where L is the longest dimension in millimeters of the surface area of the diamond, and t is the thickness of the diamond in millimeters.

7. The method as defined by claim 5, wherein said surface area is the area of a disc of about 4 inches diameters.

8. The method as defined by claim 6, wherein said surface area is the area of a disc of about 4 inches diameters.

* * * * *

UNITED STATES PATENT AND TRADEMARK OFFICE
CERTIFICATE OF CORRECTION

PATENT NO. : 5,507,987
DATED : April 16, 1996
INVENTOR(S) : Henry Windischmann

It is certified that error appears in the above-indentified patent and that said Letters Patent is hereby corrected as shown below:

Column 1, line 11, insert the following new paragraph:

--The present invention was made with Government support, and the Government has certain rights in the invention.--

Signed and Sealed this

Eighteenth Day of February, 1997

Attest:

BRUCE LEHMAN

*Attesting Officer*    *Commissioner of Patents and Trademarks*